(12) United States Patent
Deng (10) Patent No.: US 10,479,212 B2
(45) Date of Patent: Nov. 19, 2019

(54) ELECTRIC VEHICLE AND VOLTAGE ACQUISITION CIRCUIT THEREOF

(71) Applicant: Shenzhen Anding New Energy Technology Development Co., Ltd., Shenzhen, Guangdong (CN)

(72) Inventor: Hong Deng, Guangdong (CN)

(73) Assignee: Shenzhen Anding New Energy Technology Development Co., Ltd., Shenzhen (CN)

(*) Notice: Subject to any disclaimer, the term of this patent is extended or adjusted under 35 U.S.C. 154(b) by 176 days.

(21) Appl. No.: 15/787,726

(22) Filed: Oct. 19, 2017

(65) Prior Publication Data

US 2018/0105057 A1    Apr. 19, 2018

(30) Foreign Application Priority Data

Oct. 19, 2016   (CN) .......................... 2016 2 1138051

(51) Int. Cl.
| | |
|---|---|
| *B60L 11/18* | (2006.01) |
| *G01R 31/396* | (2019.01) |
| *G01R 15/04* | (2006.01) |
| *G01R 19/252* | (2006.01) |
| *G01R 31/3835* | (2019.01) |
| *B60L 58/12* | (2019.01) |
| *B60L 58/21* | (2019.01) |

(52) U.S. Cl.
CPC ........... *B60L 11/1861* (2013.01); *B60L 58/12* (2019.02); *G01R 15/04* (2013.01); *G01R 19/252* (2013.01); *G01R 31/3835* (2019.01); *G01R 31/396* (2019.01); *B60L 58/21* (2019.02)

(58) Field of Classification Search
CPC ...... B60L 11/1861; B60L 58/12; B60L 58/21; G01R 31/3835; G01R 31/396; G01R 19/252; G01R 15/04
USPC .................................................. 324/425–437
See application file for complete search history.

(56) References Cited

U.S. PATENT DOCUMENTS

| | | | |
|---|---|---|---|
| 6,236,216 B1* | 5/2001 | Shimoyama ............ | G01K 7/203 324/434 |
| 6,577,135 B1* | 6/2003 | Matthews ........... | G01R 19/0092 324/426 |
| 8,237,406 B2* | 8/2012 | Zheng .................. | H02J 7/0016 320/116 |
| 2004/0051534 A1* | 3/2004 | Kobayashi ........ | G01R 19/16542 324/429 |

(Continued)

*Primary Examiner* — Jeff W Natalini (57) ABSTRACT

The present invention provides a voltage acquisition circuit. The voltage acquisition circuit includes a voltage division and sampling module, a voltage to frequency conversion module, and an isolation module. The voltage to frequency conversion module is electrically coupled to the voltage division and sampling module and the isolation module. The voltage division and sampling module is configured to divide and sample a total voltage of a battery pack, and output a voltage signal to the voltage to frequency conversion module. The voltage to frequency conversion module is configured to convert the voltage signal into a first frequency signal, and output the first frequency signal to the isolation module. The isolation module is configured to electrically isolate the first frequency signal, to generate a second frequency signal. The present invention further provides an electric vehicle with the voltage acquisition circuit.

20 Claims, 3 Drawing Sheets

(56) References Cited

U.S. PATENT DOCUMENTS

2018/0212278 A1* 7/2018 Kurosaki .................. H02J 7/02

* cited by examiner

ELECTRIC VEHICLE AND VOLTAGE ACQUISITION CIRCUIT THEREOF

CROSS REFERENCE TO RELATED APPLICATIONS

The present application claims the benefit of Chinese Patent Application No. 201621138051.1 filed on Oct. 19, 2016, the contents of which are hereby incorporated by reference.

BACKGROUND OF THE INVENTION

Field of the Invention

This invention relates to electric vehicles, and more particular, to an electric vehicle having a voltage acquisition circuit.

Description of the Related Art

At present, electric vehicles are powered by battery packs, and each electric vehicle uses a battery management system (BMS) to manage a battery pack thereof. Generally, the BMS should obtain a total voltage of the battery pack, and manages the battery pack, according to the total voltage. If an accuracy of the total voltage of the battery pack obtained by the BMS is low, the BMS cannot manage the battery pack properly.

It is desirable to provide an invention, which can overcome the problems and limitations mentioned above.

SUMMARY OF THE INVENTION

The present invention is directed to an electric vehicle and a voltage acquisition circuit of the electric vehicle that substantially obviates one or more of the problems due to limitations and disadvantages of the related art.

In an aspect of the present invention, there is provided a voltage acquisition circuit comprising a voltage division and sampling module, a voltage to frequency conversion module, and an isolation module. The voltage division and sampling module is electrically coupled to a battery pack. The voltage division and sampling module comprises a first voltage division unit, a second voltage division unit, a sampling unit, and a comparison unit. The sampling unit comprises a first terminal electrically coupled to a positive terminal of the battery pack through the first voltage division unit, and a second terminal electrically coupled to a negative terminal of the battery pack through the second voltage division unit. The comparison unit comprises a first input terminal electrically coupled to the first terminal of the sampling unit, a second input terminal electrically coupled to the second terminal of the sampling unit, and an output terminal. The voltage to frequency conversion module is electrically coupled to the output terminal of the comparison unit, to receive a voltage signal from the comparison unit. The voltage to frequency conversion module is configured to convert the voltage signal into a first frequency signal. The isolation module is electrically coupled to the voltage to frequency conversion module, to receive the first frequency signal. The isolation module is configured to electrically isolate the first frequency signal, to generate a second frequency signal.

In another aspect of the present invention, there is provided an electric vehicle comprising a battery pack, a voltage acquisition circuit, and a battery management system (BMS). The battery pack comprises a positive terminal and a negative terminal. The voltage acquisition circuit comprises a voltage division and sampling module, a voltage to frequency conversion module, and an isolation module. The voltage division and sampling module comprises a first voltage division unit, a second voltage division unit, a sampling unit, and a comparison unit. The sampling unit comprises a first terminal electrically coupled to the positive terminal of the battery pack through the first voltage division unit, and a second terminal electrically coupled to the negative terminal of the battery pack through the second voltage division unit. The comparison unit comprises a first input terminal electrically coupled to the first terminal of the sampling unit, a second input terminal electrically coupled to the second terminal of the sampling unit, and an output terminal. The voltage to frequency conversion module is electrically coupled to the output terminal of the comparison unit, to receive a voltage signal from the comparison unit. The voltage to frequency conversion module is configured to convert the voltage signal into a first frequency signal. The isolation module is electrically coupled to the voltage to frequency conversion module, to receive the first frequency signal. The isolation module is configured to electrically isolate the first frequency signal, to generate a second frequency signal. The BMS is electrically coupled to the isolation module, to receive the second frequency signal. The BMS is configured to manage the battery pack, according to the second frequency signal.

It is to be understood that both the foregoing general description and the following detailed description are exemplary and explanatory and are intended to provide further explanations of the invention as claimed.

BRIEF DESCRIPTION OF THE DRAWINGS

Implementations of the present technology will now be described, by way of example only, with reference to the attached drawings. It may be understood that these drawings are not necessarily drawn to scale, and in no way limit any changes in form and detail that may be made to the described embodiments by one skilled in the art without departing from the spirit and scope of the described embodiments.

DETAILED DESCRIPTION OF THE PREFERRED EMBODIMENTS

In order to make the purposes, technical solutions, and advantages of the present invention be clearer, the present invention will be further described in detail hereafter with reference to the accompanying drawings and embodiments. However, it will be understood by those of ordinary skill in the art that the embodiments described herein can be practiced without these specific details. In other instances, methods, procedures and components have not been described in detail so as not to obscure the related relevant feature being described. Also, it should be understood that the embodiments described herein are only intended to illustrate but not to limit the present invention.

Several definitions that apply throughout this disclosure will be presented. The term "coupled" is defined as connected, whether directly or indirectly through intervening components, and is not necessarily limited to physical connections. The connection can be such that the objects are permanently connected or releasably connected. The term "comprise", when utilized, means "include, but not necessarily limited to"; it specifically indicates open-ended inclusion or membership in a so-described combination, group, series and the like.

It should be noted that references to "an" or "one" embodiment in this disclosure are not necessarily to the same embodiment, and such references mean "at least one."

Figure 1:
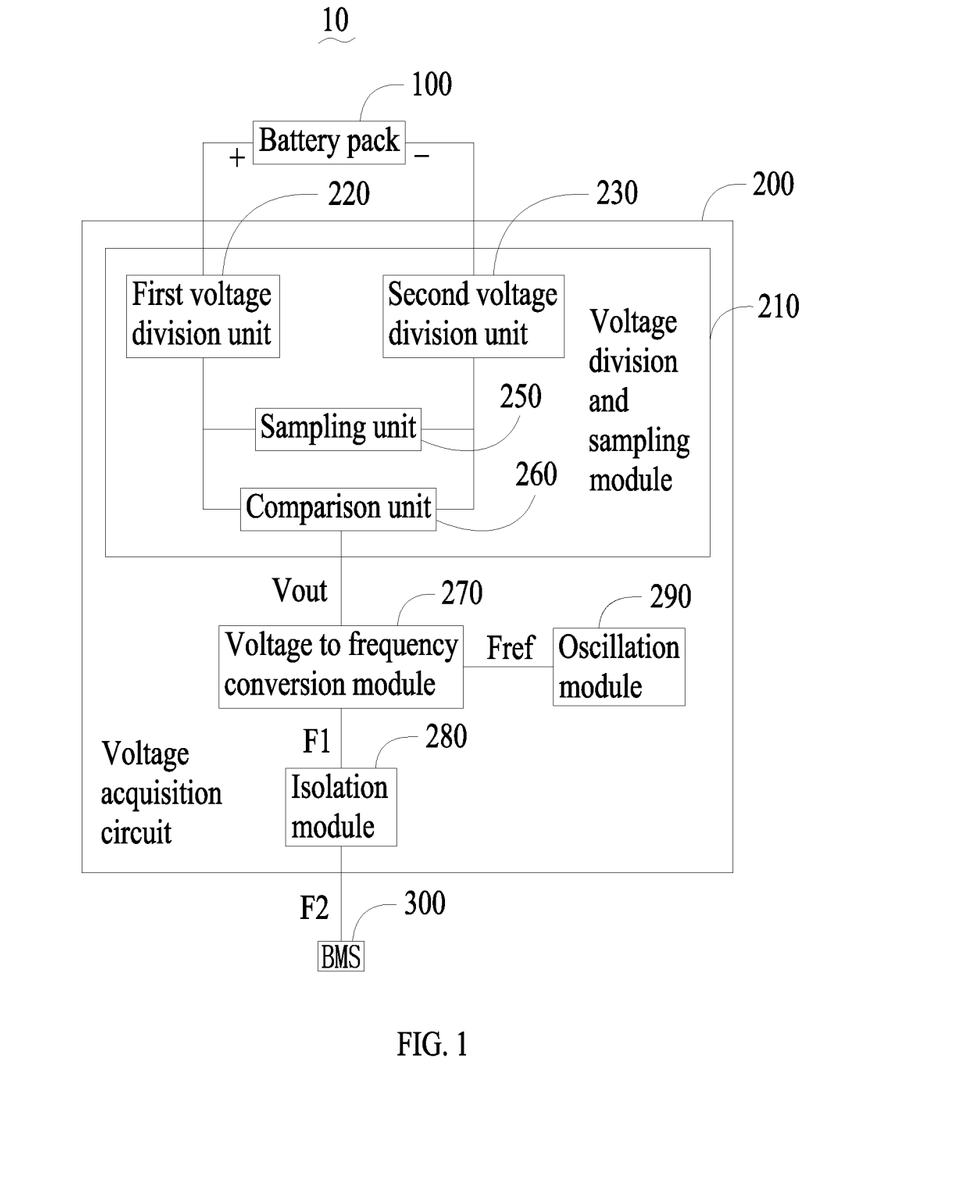
FIG. 1 is a block schematic diagram of an electric vehicle provided by one embodiment of the present invention; wherein the electric vehicle comprises a voltage acquisition circuit comprising a voltage division and sampling module, a voltage to frequency conversion module, an isolation module, and an oscillation module.

FIG. 1 illustrates a block schematic diagram of an electric vehicle 10 provided by one embodiment of the present invention. The electric vehicle 10 comprises a battery pack 100, a voltage acquisition circuit 200, and a battery management system (BMS) 300. The voltage acquisition circuit 200 is electrically coupled to the battery pack 100 and the BMS 300. The voltage acquisition circuit 200 is configured to collect a voltage signal Vout of the battery pack 100, convert the voltage signal Vout into a second frequency signal F2, and output the second frequency signal F2 to the BMS 300. The BMS 300 is configured to manage the battery pack 100, according to the second frequency signal F2. It may understood that, the battery pack 100 can comprise a plurality of rechargeable batteries configured in a series, parallel or a mixture of both to store and deliver electric energy.

The voltage acquisition circuit 200 comprises a voltage division and sampling module 210, a voltage to frequency conversion module 270, an isolation module 280, and an oscillation module 290. The voltage to frequency conversion module 270 is electrically coupled to the battery pack 100 through the voltage division and sampling module 210, and electrically coupled to the BMS 300 through the isolation module 280. The oscillation module 290 electrically coupled to the voltage to frequency conversion module 270. The voltage division and sampling module 210 is configured to divide and sample a total voltage of the battery pack 100, and output the voltage signal Vout to the voltage to frequency conversion module 270. The voltage to frequency conversion module 270 is configured to convert the voltage signal Vout into a first frequency signal F1, and output the first frequency signal F1 to the isolation module 280. The isolation module 280 is configured to electrically isolate the first frequency signal F1, to generate the second frequency signal F2, and output the second frequency signal F2 to the BMS 300. The BMS 300 is configured to manage the battery pack 100, according to the second frequency signal F2. The oscillation module 290 is configured to generate a reference frequency signal Fref, and output the reference frequency signal Fref to the voltage to frequency conversion module 270.

The voltage division and sampling module 210 comprises a first voltage division unit 220, a second voltage division unit 230, a sampling unit 250, and a comparison unit 260. The battery pack 100 comprises a positive terminal and a negative terminal. The sampling unit 250 comprises a first terminal electrically coupled to the positive terminal of the battery pack 100 through the first voltage division unit 220, and a second terminal electrically coupled to the negative terminal of the battery pack 100 through the second voltage division unit 230. The comparison unit 260 comprises a first input terminal electrically coupled to the first terminal of the sampling unit 250, a second input terminal electrically coupled to the second terminal of the sampling unit 250, and an output terminal electrically coupled to the voltage to frequency conversion module 270. The comparison unit 260 is configured to compare a voltage difference between the first terminal and the second terminal of the sampling unit 250, to generate the voltage signal Vout.

Figure 2:
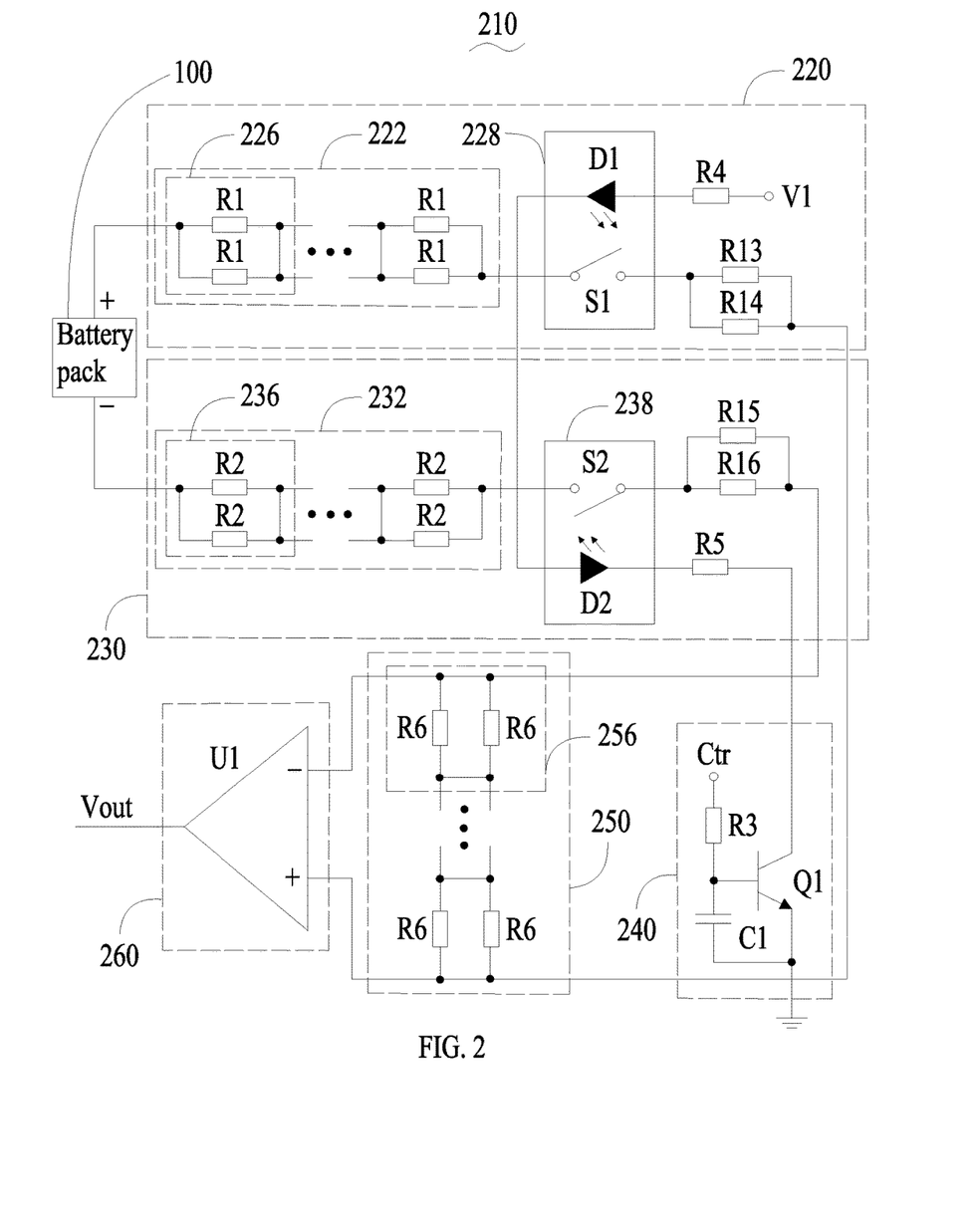
FIG. 2 is a circuit diagram of the voltage division and sampling module of FIG. 1.

FIG. 2 illustrates a circuit diagram of the voltage division and sampling module 210 provided by one embodiment of the present invention. The first voltage division unit 220 comprises a first voltage division subunit 222. The first voltage division subunit 222 comprises a plurality of first voltage division elements 226 electrically coupled in series between the positive terminal of the battery pack 100 and the first terminal of the sampling unit 250. Each first voltage division element 226 comprises two first resistors R1 electrically coupled in parallel.

The second voltage division unit 230 comprises a second voltage division subunit 232. The second voltage division subunit 232 comprises a plurality of second voltage division elements 236 electrically coupled in series between the negative terminal of the battery pack 100 and the second terminal of the sampling unit 250. Each second voltage division element 236 comprises two second resistors R2 electrically coupled in parallel.

In one embodiment, the voltage division and sampling module 210 further comprises a control unit 240. The control unit 240 is configured to control whether the first voltage division unit 220 and the second voltage division unit 230 electrically coupled to the sampling unit 250. The control unit 240 comprises a third resistor R3, a capacitor C1, and an electronic switch Q1. The electronic switch Q1 comprises a first terminal configured to receive a control signal Ctr through the third resistor R3, and electrically coupled to ground though the capacitor C1, a second terminal electrically coupled to the first voltage division unit 220 through the second voltage division unit 230, and a third terminal electrically coupled to ground.

The first voltage division unit 220 further comprises a first optocoupler 228 and a fourth resistor R4. The second voltage division unit 230 further comprises a second optocoupler 238 and a fifth resistor R5. The first optocoupler 228 comprises a first light emitting element D1 and a first light receiving element S1. The second optocoupler 238 comprises a second light emitting element D2 and a second light receiving element S2. The first light emitting element D1 comprises a first terminal electrically coupled to a first power supply V1 through the fourth resistor R4, and a second terminal. The first light receiving element S1 comprises a first terminal electrically coupled to the first voltage division subunit 222, and a second terminal electrically coupled to the first terminal of the sampling unit 250. The second light emitting element D2 comprises a first terminal electrically coupled to the second terminal first light emitting element D1, and a second terminal electrically coupled to the second terminal of the electronic switch Q1 through the fifth resistor R5. The second light receiving element S2 comprising a first terminal electrically coupled to the second voltage division subunit 232, and a second terminal electrically coupled to the second terminal of the sampling unit 250.

The sampling unit 250 comprises a plurality of third voltage division elements 256 electrically coupled in series between the first voltage division unit 220 and the second voltage division unit 230. Each third voltage division element 256 comprising two sixth resistors R6 electrically coupled in parallel.

The comparison unit 260 comprises an operational amplifier U1. The operational amplifier U1 comprises a non-inverting input terminal, an inverting input terminal, and an output terminal. The non-inverting input terminal of the operational amplifier U1 function as the first input terminal of the comparison unit 260, and is electrically coupled to the first terminal of the sampling unit 250. The inverting input terminal of the operational amplifier U1 function as the second input terminal of the comparison unit 260, and is electrically coupled to the second terminal of the sampling unit 250. The output terminal of the operational amplifier U1 function as the output terminal of the comparison unit 260, and is electrically coupled to the voltage to frequency conversion module 270, to output the voltage signal Vout to the voltage to frequency conversion module 270.

Figure 3:
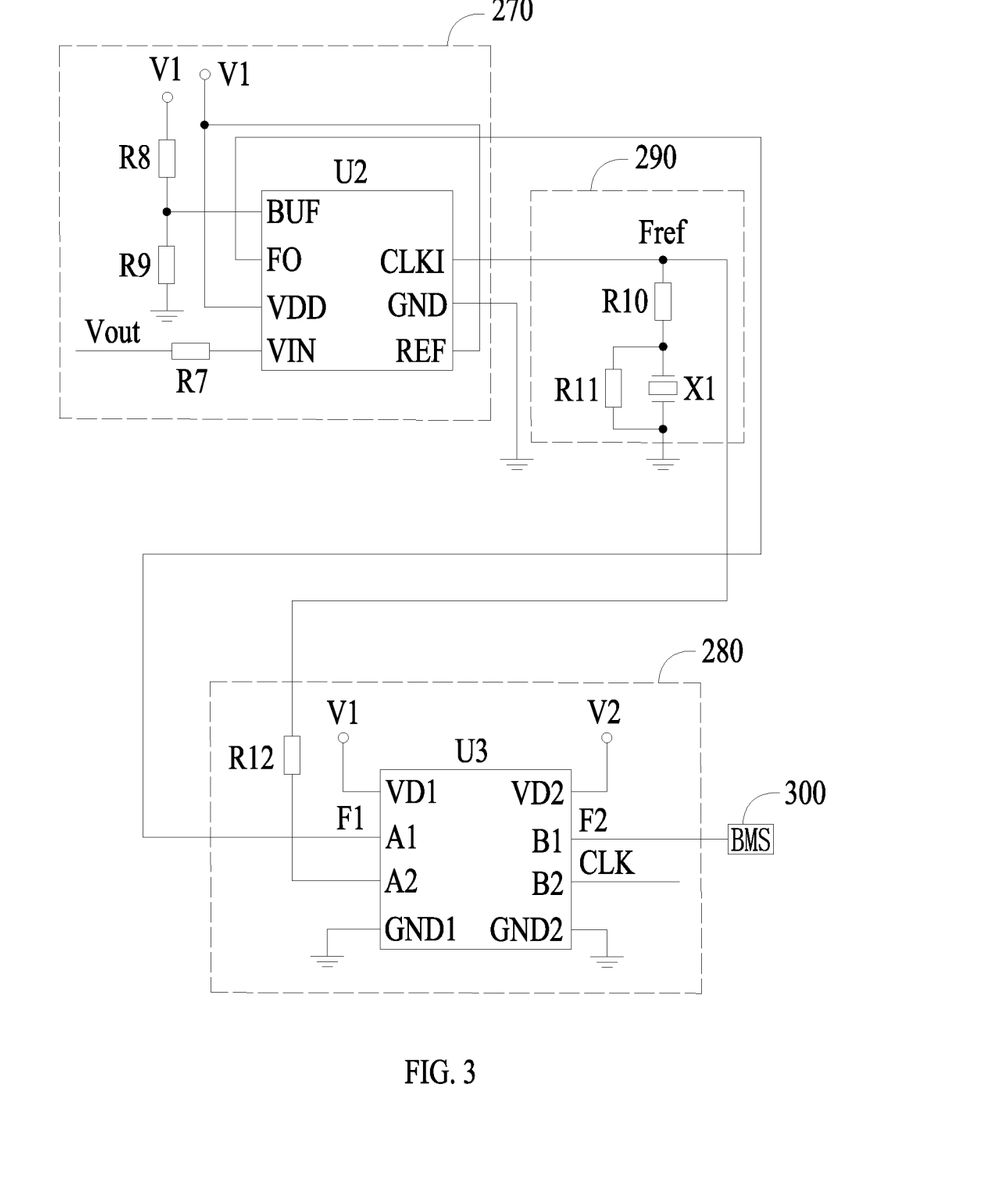
FIG. 3 is a circuit diagram of the voltage to frequency conversion module, the isolation module, and the oscillation module of FIG. 1.

FIG. 3 illustrates a circuit diagram of the voltage to frequency conversion module 270, the isolation module 280, and the oscillation module 290 provided by one embodiment of the present invention. The voltage to frequency conversion module 270 comprises a seventh resistor R7, an eighth resistor R8, a ninth resistor R9, and a converter U2. The converter U2 comprises an input pin VIN, a buffer pin BUF, a power pin VDD, a reference pin REF, a clock pin CLKI, and an output pin FO, and a ground pin GND. The input pin VIN of the converter U2 is electrically coupled to the output terminal the operational amplifier U1 through the seventh resistor R7, to receive the voltage signal Vout. The buffer pin BUF of the converter U2 is electrically coupled to a first power supply V1 through the eighth resistor R8, and electrically coupled to ground through the ninth resistor R9. The power pin VDD of the converter U2 is electrically coupled to the first power supply V1. The reference pin REF of the converter U2 is electrically coupled to the first power supply V1. The clock pin CLKI of the converter U2 is configured to receive a reference frequency signal Fref. The output pin FO of the converter U2 is electrically coupled to the isolation module 280, to output the first frequency signal F1 to the isolation module 280. The ground pin GND of the converter U2 is electrically coupled to ground.

The isolation module 280 comprises an isolator U3. The isolator U3 comprises a first input pin A1 electrically coupled to the output pin FO of the converter U2, to receive the first frequency signal F1; and a first output pin B1 electrically coupled to the BMS 300, and configured to output the second frequency signal F2 to the BMS 300.

In one embodiment, the isolator U3 further comprises a first power pin VD1 electrically coupled to the first power supply V1, a second power pin VD2 electrically coupled to a second power supply V2, a first ground pin GND1 electrically coupled to ground, and a second ground pin GND2 electrically coupled to ground.

In one embodiment, the reference frequency signal Fref is provided by the oscillation module 290. The oscillation module 290 comprises a tenth resistor R10, an eleventh resistor R11, and an oscillator X1. The oscillator X1 comprises a first terminal electrically coupled to the clock pin CLKI of the converter U2 though the tenth resistor R10, to output the reference frequency signal Fref to the converter U2, and a second terminal electrically coupled to ground. The first terminal of the oscillator X1 is further electrically coupled to ground through the eleventh resistor R11.

In one embodiment, the reference frequency signal Fref is provided by the isolator U3, on condition that number of pins of the isolator is sufficient. When the reference frequency signal Fref is provided by the isolator U3, the isolator U3 further comprises a second input pin B2 configured to receive a clock signal CLK, and a second output pin A2 configured to output the reference frequency signal Fref. The isolation module 280 further comprises a twelfth resistor R12. The second output pin A2 of the isolator U3 is electrically coupled to the clock pin CLKI of the converter U2 through the twelfth resistor R12, to output reference frequency signal Fref to the converter U2. The isolator U3 is configured to electrically isolated the first frequency signal F1 received by the first input pin A1 and the second frequency signal F2 outputted from the first output pin B1, and further electrically isolated the clock signal CLK received by the second input pin B2 and the reference frequency signal Fref outputted from the second output pin A2.

That is, when the reference frequency signal Fref is provided by the isolator U3, the twelfth resistor R12 is electrically coupled to the converter U2 and the isolator U3; and when the reference frequency signal Fref is provided by the oscillation module 290, the twelfth resistor R12 is not electrically coupled to the converter U2 and the isolator U3, and can be omitted.

Please refer to FIG. 2 again, in one embodiment, the first voltage division unit 220 further comprises a thirteenth resistor R13 and a fourteenth resistor R14, and the second voltage division unit 230 further comprises a fifteenth resistor R15 and a sixteenth resistor R16. The second terminal of the first light receiving element S1 is electrically coupled to the first terminal of the sampling unit 250 through the thirteenth resistor R13, and electrically coupled to the first terminal of the sampling unit 250 through the fourteenth resistor R14. The second terminal of the second light receiving element S2 is electrically coupled to the second terminal of the sampling unit 250 through the fifteenth resistor R15, and electrically coupled to the second terminal of the sampling unit 250 through the sixteenth resistor R16.

In one embodiment, the electronic switch Q1 is an npn-type bipolar junction transistor (BJT), and the first terminal, the second terminal, and the third terminal of the electronic switch Q1 correspond to a base, a collector, and an emitter of the npn-type BJT. In other embodiments, the electronic switch Q1 may be a switch having a similar function, such as a metal-oxide-semiconductor field-effect transistor (MOSFET), or an insulated gate bipolar transistor (IGBT).

The operation principle of the electric vehicle 10 and the voltage acquisition circuit 200 provided by one embodiment of the present invention will be described below.

When the BMS 300 needs to acquire the total voltage of the battery pack 100, the first terminal of the electronic switch Q1 receives a first control signal (such as, a high level signal), and the electronic switch Q1 is turned on. The first light emitting element D1 and the second light emitting element D2 are lit, the first light receiving element S1 and the second light receiving element S2 are turned on. A loop is formed between the positive terminal of the battery pack 100, the first voltage division subunit 222, the first light receiving element S1, the sampling unit 250, the second light receiving element S2, the second voltage division subunit 232, and the negative terminal of the battery pack 100. The operational amplifier U1 compares the voltage difference between the first terminal and the second terminal of the sampling unit 250, to generate the voltage signal Vout, and outputs the voltage signal Vout to the converter U2. The converter U2 adjusts a frequency of a signal outputted from the converter U2 according to the voltage signal Vout, on the basis of the reference frequency signal Fref, and the first frequency signal F1 is linearly related to the voltage signal Vout. That is, a frequency of the first frequency signal F1 can linearly characterize a voltage value of the voltage signal Vout. The isolator U3 electrically isolates the first frequency signal F1, to generate the second frequency signal F2, and outputs the second frequency signal F2 to the BMS 300. The BMS 300 calculates a relevant information of the battery pack 100, such as the total voltage of the battery pack 100, based on the second frequency signal F2; and manages the battery pack 100, according to the second frequency signal F2.

In one embodiment, a linear relationship between the first frequency signal F1 and the voltage signal Vout is complied with the following equation:

$$F_{OUT} = 0.1 \times f_{CLKIN} + 0.8 \times \frac{V_{IN}}{V_{ref}} \times f_{CLKIN} \qquad \text{(equation 1)}$$
$$= 0.1 \times f_{CLKIN} + 0.8 \times \frac{V_{HVIN}}{204 \times V_{ref}} \times f_{CLKIN}$$

wherein $F_{OUT}$ represents a frequency of the first frequency signal F1, $f_{CLKIN}$ represents a frequency of the reference frequency signal Fref, $V_{IN}$ represents a voltage value of the voltage signal Vout, $V_{ref}$ represents a reference voltage, and $V_{HVIN}$ represents the total voltage of the battery pack 100.

In one embodiment, the frequency of the reference frequency signal Fref is 400 KHz, the reference voltage is 5V, and the total voltage of the battery pack 100 is 1000V. That is, $f_{CLKIN}$=400 KHz. $V_{ref}$=5V. when $f_{CLKIN}$=400 KHz, $V_{ref}$=5V is substituted into equation 1, a range of the total voltage of the battery pack 100 $V_{HVIN}\in[-30.6, 1050.6]$ is obtained. Therefore, the voltage to frequency conversion module 270 enables the voltage acquisition circuit 200 to acquire a negative voltage, and to achieve an over-range voltage acquisition.

When the first terminal of the electronic switch Q1 receives a second control signal (such as, a low level signal), and the electronic switch Q1 is turned off. The first light emitting element D1 and the second light emitting element D2 are not lit, the first light receiving element S1 and the second light receiving element S2 are turned off. A high voltage of the battery pack 100 cannot be electrically coupled to the voltage acquisition circuit 200, and the voltage division and sampling module 210 is no output.

In one embodiment, the high voltage (such as 1000V) outputted from the battery pack 100 is divided by the first voltage division unit 220 and the second voltage division unit 230, and a voltage (such as 5V) outputted from the sampling unit 250 can meet voltage requirements of the following units and modules, such as the comparison unit 260, and the voltage to frequency conversion module 270. The operational amplifier U1 converts a differential signal outputted from the sampling unit 250 into a single-ended signal, and improves an impedance matching and an output capability of the voltage division and sampling module 210. The control unit 240 controls the first optocoupler 228 and the second optocoupler 238 to be turned on or turned off, controls whether the first voltage division unit 220 and the second voltage division unit 230 electrically coupled to the sampling unit 250, and controls whether the battery pack 100 is electrically coupled to the voltage acquisition circuit 200. Therefore, the battery pack 100 cannot be affected by the voltage acquisition circuit 200, on condition that the voltage acquisition circuit 200 is abnormal; and the voltage acquisition circuit 200 cannot be affected by the battery pack 100, on condition that the battery pack 100 is abnormal.

In one embodiment, the frequency of the first frequency signal F1 can linearly characterize the voltage value of the voltage signal Vout, and the frequency of the first frequency signal F1 can also linearly characterize the total voltage value of the battery pack 100. A frequency of the second frequency signal F2 is equal to the frequency of the first frequency signal F1, and the second frequency signal F2 and the first frequency signal F1 have been electrically isolated from a high voltage side and a low voltage side. It may be appreciated that, each of the first frequency signal F1 and the second frequency signal F2 is more stable, more resistant to interference, more accurate, and easier to be processed, than analog signals and digital signals. Therefore, the total voltage of the battery pack 100 collected by the voltage acquisition circuit 200 is more accurate.

As detail above, the voltage division and sampling module 210 converts the high voltage outputted from the battery pack 100 into the voltage signal Vout, and the voltage to frequency conversion module 270 converts the voltage signal Vout into the first frequency signal F1. Therefore, the voltage acquisition circuit 200 can acquire a negative voltage and achieve an over-range voltage acquisition. The isolation module 280 electrically isolates the first frequency signal F1, to generate the second frequency signal F2, and each of the first frequency signal F1 and the second frequency signal F2 has high stability, strong anti-interference ability and high accuracy. Therefore, the total voltage of the battery pack 100 collected by the voltage acquisition circuit 200 is more accurate.

Furthermore, the control unit 240 controls the first optocoupler 228 and the second optocoupler 238 to be turned on or turned off, controls whether the first voltage division unit 220 and the second voltage division unit 230 electrically coupled to the sampling unit 250, and controls whether the battery pack 100 is electrically coupled to the voltage acquisition circuit 200. Therefore, the battery pack 100 cannot be affected by the voltage acquisition circuit 200, on condition that the voltage acquisition circuit 200 is abnormal; and the voltage acquisition circuit 200 cannot be affected by the battery pack 100, on condition that the battery pack 100 is abnormal.

It will be apparent to those skilled in the art that various modification and variations can be made in the multicolor illumination device and related method of the present invention without departing from the spirit or scope of the invention. Thus, it is intended that the present invention cover modifications and variations that come within the scope of the appended claims and their equivalents.

What is claimed is:

1. A voltage acquisition circuit (200), comprising:
   a voltage division and sampling module (210) electrically coupled to a battery pack (100), the voltage division and sampling module (210) comprising:
   a first voltage division unit (220) and a second voltage division unit (230);
   a sampling unit (250) comprising a first terminal electrically coupled to a positive terminal of the battery pack (100) through the first voltage division unit (220), and a second terminal electrically coupled to a negative terminal of the battery pack (100) through the second voltage division unit (230); and
   a comparison unit (260) comprising a first input terminal electrically coupled to the first terminal of the sampling unit (250), a second input terminal electrically coupled to the second terminal of the sampling unit (250), and an output terminal;
   a voltage to frequency conversion module (270) electrically coupled to the output terminal of the comparison unit (260), to receive a voltage signal (Vout) from the comparison unit (260), the voltage to frequency conversion module (270) configured to convert the voltage signal (Vout) into a first frequency signal (F1); and an isolation module (280) electrically coupled to the voltage to frequency conversion module (270), to receive the first frequency signal (F1), the isolation module (280) configured to electrically isolate the first frequency signal (F1), to generate a second frequency signal (F2).

2. The voltage acquisition circuit (200) of claim 1, wherein the first voltage division unit (220) comprises a first voltage division subunit (222) comprising a plurality of first voltage division elements (226) electrically coupled in series between the positive terminal of the battery pack (100) and the first terminal of the sampling unit (250), and each first voltage division element (226) comprising two first resistors (R1) electrically coupled in parallel.

3. The voltage acquisition circuit (200) of claim 2, wherein the second voltage division unit (230) comprises a second voltage division subunit (232) comprising a plurality of second voltage division elements (236) electrically coupled in series between the negative terminal of the battery pack (100) and the second terminal of the sampling unit (250), and each second voltage division element (236) comprising two second resistors (R2) electrically coupled in parallel.

4. The voltage acquisition circuit (200) of claim 3, wherein the voltage division and sampling module (210) further comprises a control unit (240) configured to control whether the first voltage division unit (220) and the second voltage division unit (230) electrically coupled to the sampling unit (250); the control unit (240) comprises:

a third resistor (R3) and a capacitor (C1); and an electronic switch (Q1) comprising a first terminal configured to receive a control signal (Ctr) through the third resistor (R3), and electrically coupled to ground though the capacitor (C1), a second terminal electrically coupled to the first voltage division unit (220) through the second voltage division unit (230), and a third terminal electrically coupled to ground.

5. The voltage acquisition circuit (200) of claim 4, wherein the first voltage division unit (220) further comprises a first optocoupler (228) and a fourth resistor (R4), and the second voltage division unit (230) further comprises a second optocoupler (238) and a fifth resistor (R5);

the first optocoupler (228) comprising:

a first light emitting element (D1) comprising a first terminal electrically coupled to a first power supply (V1) through the fourth resistor (R4), and a second terminal; and a first light receiving element (S1) comprising a first terminal electrically coupled to the first voltage division subunit (222), and a second terminal electrically coupled to the first terminal of the sampling unit (250); and the second optocoupler (238) comprising:

a second light emitting element (D2) comprising a first terminal electrically coupled to the second terminal first light emitting element (D1), and a second terminal electrically coupled to the second terminal of the electronic switch (Q1) through the fifth resistor (R5); and a second light receiving element (S2) comprising a first terminal electrically coupled to the second voltage division subunit (232), and a second terminal electrically coupled to the second terminal of the sampling unit (250).

6. The voltage acquisition circuit (200) of claim 1, wherein the sampling unit (250) comprises a plurality of third voltage division elements (256) electrically coupled in series between the first voltage division unit (220) and the second voltage division unit (230), and each third voltage division element (256) comprising two sixth resistors (R6) electrically coupled in parallel.

7. The voltage acquisition circuit (200) of claim 1, wherein the comparison unit (260) comprises an operational amplifier (U1) comprising a non-inverting input terminal functioning as the first input terminal of the comparison unit (260) and electrically coupled to the first terminal of the sampling unit (250), an inverting input terminal functioning as the second input terminal of the comparison unit (260) and electrically coupled to the second terminal of the sampling unit (250), and an output terminal functioning as the output terminal of the comparison unit (260) and electrically coupled to the voltage to frequency conversion module (270), to output the voltage signal (Vout) to the voltage to frequency conversion module (270).

8. The voltage acquisition circuit (200) of claim 7, wherein the voltage to frequency conversion module (270) comprises:

a seventh resistor (R7), an eighth resistor (R8), and a ninth resistor (R9); and a converter (U2) comprising an input pin (VIN) electrically coupled to the output terminal the operational amplifier (U1) through the seventh resistor (R7), to receive the voltage signal (Vout); a buffer pin (BUF) electrically coupled to a first power supply (V1) through the eighth resistor (R8), and electrically coupled to ground through the ninth resistor (R9); a power pin (VDD) electrically coupled to the first power supply (V1); a reference pin (REF) electrically coupled to the first power supply (V1); a clock pin (CLKI) configured to receive a reference frequency signal (Fref); and an output pin (FO) electrically coupled to the isolation module (280), to output the first frequency signal (F1) to the isolation module (280).

9. The voltage acquisition circuit (200) of claim 8, wherein the isolation module (280) comprises an isolator (U3) comprising a first input pin (A1) electrically coupled to the output pin (FO) of the converter (U2), to receive the first frequency signal (F1); and a first output pin (B1) configured to output the second frequency signal (F2).

10. The voltage acquisition circuit (200) of claim 9, wherein the voltage acquisition circuit (200) further comprises an oscillation module (290) configured to generate the reference frequency signal (Fref); the oscillation module (290) comprises a tenth resistor (R10), an eleventh resistor (R11), and an oscillator (X1); the oscillator (X1) comprises a first terminal electrically coupled to the clock pin (CLKI) of the converter (U2) though the tenth resistor (R10), to output the reference frequency signal (Fret) to the converter (U2), and a second terminal electrically coupled to ground; and the first terminal of the oscillator (X1) is further electrically coupled to ground through the eleventh resistor (R11).

11. An electric vehicle (10), comprising:

a battery pack (100) comprising a positive terminal and a negative terminal;

a voltage acquisition circuit (200) comprising:

a voltage division and sampling module (210) comprising:

a first voltage division unit (220) and a second voltage division unit (230);

a sampling unit (250) comprising a first terminal electrically coupled to the positive terminal of the battery pack (100) through the first voltage division unit (220), and a second terminal electrically coupled to the negative terminal of the battery pack (100) through the second voltage division unit (230); and a comparison unit (260) comprising a first input terminal electrically coupled to the first terminal of the sampling unit (250), a second input terminal electrically coupled to the second terminal of the sampling unit (250), and an output terminal;

a voltage to frequency conversion module (270) electrically coupled to the output terminal of the comparison unit (260), to receive a voltage signal (Vout) from the comparison unit (260), the voltage to frequency conversion module (270) configured to convert the voltage signal (Vout) into a first frequency signal (F1); and an isolation module (280) electrically coupled to the voltage to frequency conversion module (270), to receive the first frequency signal (F1), the isolation module (280) configured to electrically isolate the first frequency signal (F1), to generate a second frequency signal (F2); and a battery management system (BMS) (300) electrically coupled to the isolation module (280), to receive the second frequency signal (F2), the BMS (300) configured to manage the battery pack (100), according to the second frequency signal (F2).

12. The electric vehicle (10) of claim 11, wherein the first voltage division unit (220) comprises a first voltage division subunit (222) comprising a plurality of first voltage division elements (226) electrically coupled in series between the positive terminal of the battery pack (100) and the first terminal of the sampling unit (250), and each first voltage division element (226) comprising two first resistors (R1) electrically coupled in parallel.

13. The electric vehicle (10) of claim 12, wherein the second voltage division unit (230) comprises a second voltage division subunit (232) comprising a plurality of second voltage division elements (236) electrically coupled in series between the negative terminal of the battery pack (100) and the second terminal of the sampling unit (250), and each second voltage division element (236) comprising two second resistors (R2) electrically coupled in parallel.

14. The electric vehicle (10) of claim 13, wherein the voltage division and sampling module (210) further comprises a control unit (240) configured to control whether the first voltage division unit (220) and the second voltage division unit (230) electrically coupled to the sampling unit (250); the control unit (240) comprises:

a third resistor (R3) and a capacitor (C1); and an electronic switch (Q1) comprising a first terminal configured to receive a control signal (Ctr) through the third resistor (R3), and electrically coupled to ground though the capacitor (C1), a second terminal electrically coupled to the first voltage division unit (220) through the second voltage division unit (230), and a third terminal electrically coupled to ground.

15. The electric vehicle (10) of claim 14, wherein the first voltage division unit (220) further comprises a first optocoupler (228) and a fourth resistor (R4), and the second voltage division unit (230) further comprises a second optocoupler (238) and a fifth resistor (R5);

the first optocoupler (228) comprising:
a first light emitting element (D1) comprising a first terminal electrically coupled to a first power supply (V1) through the fourth resistor (R4), and a second terminal; and
a first light receiving element (S1) comprising a first terminal electrically coupled to the first voltage division subunit (222), and a second terminal electrically coupled to the first terminal of the sampling unit (250); and the second optocoupler (238) comprising:
a second light emitting element (D2) comprising a first terminal electrically coupled to the second terminal first light emitting element (D1), and a second terminal electrically coupled to the second terminal of the electronic switch (Q1) through the fifth resistor (R5); and
a second light receiving element (S2) comprising a first terminal electrically coupled to the second voltage division subunit (232), and a second terminal electrically coupled to the second terminal of the sampling unit (250).

16. The electric vehicle (10) of claim 11, wherein the sampling unit (250) comprises a plurality of third voltage division elements (256) electrically coupled in series between the first voltage division unit (220) and the second voltage division unit (230), and each third voltage division element (256) comprising two sixth resistors (R6) electrically coupled in parallel.

17. The electric vehicle (10) of claim 11, wherein the comparison unit (260) comprises an operational amplifier (U1) comprising a non-inverting input terminal functioning as the first input terminal of the comparison unit (260) and electrically coupled to the first terminal of the sampling unit (250), an inverting input terminal functioning as the second input terminal of the comparison unit (260) and electrically coupled to the second terminal of the sampling unit (250), and an output terminal functioning as the output terminal of the comparison unit (260) and electrically coupled to the voltage to frequency conversion module (270), to output the voltage signal (Vout) to the voltage to frequency conversion module (270).

18. The electric vehicle (10) of claim 17, wherein the voltage to frequency conversion module (270) comprises:

a seventh resistor (R7), an eighth resistor (R8), and a ninth resistor (R9); and a converter (U2) comprising an input pin (VIN) electrically coupled to the output terminal the operational amplifier (U1) through the seventh resistor (R7), to receive the voltage signal (Vout); a buffer pin (BUF) electrically coupled to a first power supply (V1) through the eighth resistor (R8), and electrically coupled to ground through the ninth resistor (R9); a power pin (VDD) electrically coupled to the first power supply (V1); a reference pin (REF) electrically coupled to the first power supply (V1); a clock pin (CLKI) configured to receive a reference frequency signal (Fref); and an output pin (FO) electrically coupled to the isolation module (280), to output the first frequency signal (F1) to the isolation module (280).

19. The electric vehicle (10) of claim 18, wherein the isolation module (280) comprises an isolator (U3) comprising a first input pin (A1) electrically coupled to the output pin (FO) of the converter (U2), to receive the first frequency signal (F1); and a first output pin (B1) configured to output the second frequency signal (F2) to the BMS (300).

20. The electric vehicle (10) of claim 19, wherein the voltage acquisition circuit (200) further comprises an oscillation module (290) configured to generate the reference frequency signal (Fref); the oscillation module (290) comprises a tenth resistor (R10), an eleventh resistor (R11), and an oscillator (X1); the oscillator (X1) comprises a first terminal electrically coupled to the clock pin (CLKI) of the converter (U2) though the tenth resistor (R10), to output the reference frequency signal (Fref) to the converter (U2), and a second terminal electrically coupled to ground; and the first terminal of the oscillator (X1) is further electrically coupled to ground through the eleventh resistor (R11).

* * * * *